(12) United States Patent
Boulais et al.

(10) Patent No.: US 8,519,382 B2
(45) Date of Patent: Aug. 27, 2013

(54) SEMICONDUCTOR PHOTOCAPACITOR DEVICE

(75) Inventors: Kevin A. Boulais, La Plata, MD (US); Donald W. Rule, Silver Spring, MD (US); Karen J. Long, Upper Marlboro, MD (US); Francisco Santiago, Fredericksburg, VA (US); Pearl Rayms-Keller, Fredericksburg, VA (US); Victor H. Gehman, Jr., Dahlgren, VA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 342 days.

(21) Appl. No.: 12/932,934

(22) Filed: Feb. 25, 2011

(65) Prior Publication Data

US 2012/0313080 A1    Dec. 13, 2012

(51) Int. Cl.
*H01L 35/24* (2006.01)

(52) U.S. Cl.
USPC .................................... 257/40; 257/E51.001

(58) Field of Classification Search
USPC ............................................ 257/40, E51.001
See application file for complete search history.

(56) References Cited

U.S. PATENT DOCUMENTS

| | | | |
|---|---|---|---|
| 5,166,646 A | 11/1992 | Avanic et al. | 331/107 |
| 5,347,526 A | 9/1994 | Suzuki et al. | 372/20 |
| 6,324,204 B1 | 11/2001 | Deacon | 372/96 |
| 6,950,028 B2 | 9/2005 | Jones | 372/94 |
| 7,027,476 B2 | 4/2006 | Taghavi-Larigani | 372/50 |
| 7,352,264 B2 | 4/2008 | Schwab et al. | 333/203 |
| 7,508,854 B2 | 3/2009 | Honda | 372/20 |
| 7,525,711 B1 | 4/2009 | Rule et al. | 359/244 |

OTHER PUBLICATIONS

P. Blood et al.: "The electrical characterization of semi-conductors", *Rep. Prog. Phys.*, 41, 2, © 1978, 157-258. http://iopscience.iop.org/0034-4885/41/2/001/pdf/0034-4885_41_2_001.pdf.

K. A. Boulais et al.: "Tunable split-ring resonator for metamaterials using Photocapacitance of semi-insulating GaAs", *Appl. Phys. Lett.*, 93, 043518, © 2008. http://scitation.aip.org/getpdf/servlet/GetPDFServlet?filetype=pdf&id=APPLAB000093000004043518000001&idtype=cvips&doi=10.1063/1.2967192&prog=normal.

D. Wang et al.: "Reconfigurable cloak for multiple operating frequencies", *Appl. Phys. Lett.*, 93, 035515, © 2008. http://scitation.aip.org/getpdf/servlet/GetPDFServlet?filetype=pdf&id=APPLAB000093000003035515000001&idtype=cvips&doi=10.1063/1.2964187&prog=normal.

D. C. Look et al.: "On the energy level of EL2 in GaAs", *Solid-State Electronics*, 43, 7, 1317-19, © 1999.

C. T. Sah et al.: "Thermal and Optical Emission and Capture Rates and Cross Sections of Electrons and Holes at Imperfection Centers in Semiconductors from Photo and Dark Junction current and Capacitance Experiments", *Solid-State Electronics*, 13, 6, 759-88, © 1970.

*Primary Examiner* — Anthony Ho
(74) *Attorney, Agent, or Firm* — Gerhard W. Thielman, Esq.

(57) ABSTRACT

A photocapacitor device is provided for responding to a photon having at least a specified energy. The photocapacitive device includes a first portion composed of a photocapacitive material; a second portion composed of a non-photocapacitive material; and a depletion region disposed between the first and second portions. The photocapacitive and non-photocapacitive materials respectively have first and second Fermi-energy differences, with the second Fermi-energy difference being higher than the first Fermi-energy difference.

4 Claims, 4 Drawing Sheets

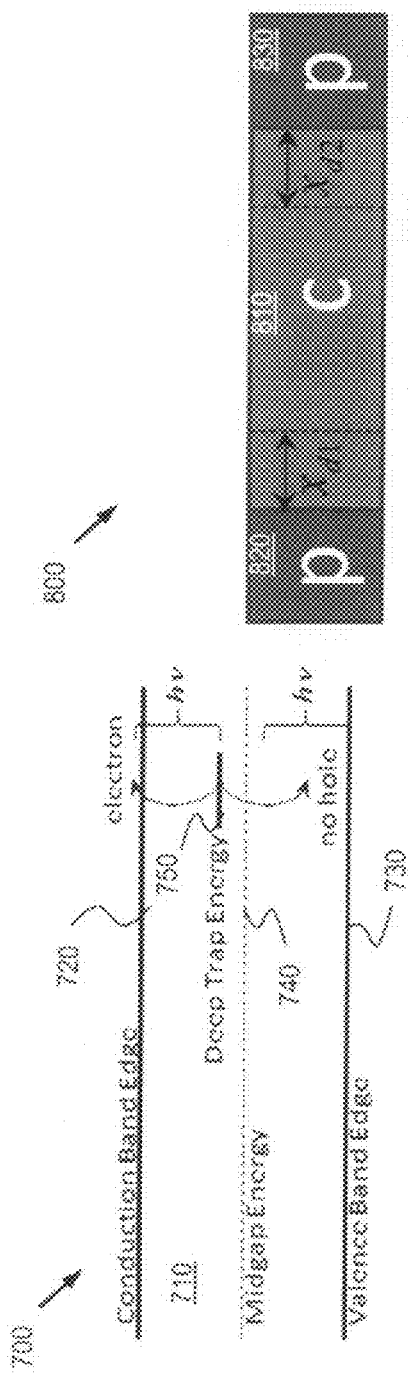
FIG. 7
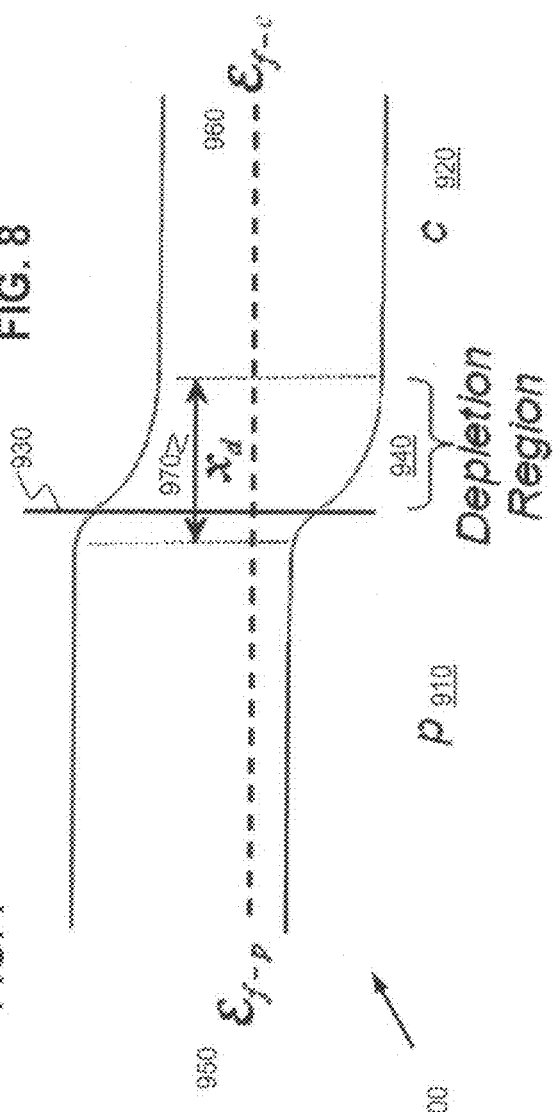
FIG. 8
FIG. 9

SEMICONDUCTOR PHOTOCAPACITOR DEVICE

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to photocapacitors that employ variation in capacitance. In particular, capacitance responds to variation in light intensity primarily, but in the alternate also responds to variation in light frequency.

Photocapacitance has been used by the scientific community for many years to investigate important aspects of semiconductor materials. By scanning the frequency of the light, various deep-level traps can be identified and characterized. For purposes of this disclosure, the term "trap" inclusively means either a trap or a recombination center, the distinction of which being that a trap generally interacts with only one species of (either) electrons or (else) holes, and a recombination center interacts with both electron and holes. In the literature, the terms are often used interchangeably.

For example, when a sudden change in capacitance is observed, the correlation to the photon energy of the light (determined by $E_{hv}=h\nu$ where h is Planck's constant and $\nu$ is the frequency) reveals the activation energy of a state within the band-gap of the material. Further, by identifying the sign of change in the capacitance, the type of trap can be determined, i.e., donor or acceptor-like. In particular, a donor type constitutes a neutral trap when filled with an electron and positively charged when empty; and an acceptor-like type represents a neutral trap when filled with a hole and negatively charged when empty.

Photocapacitance can be used to determine other information as well. There are approximately thirty variations of the photocapacitance method to determine material properties. Summary information of techniques can be found in references: P. Blood and J. W. Orton, "The electrical characterization of semiconductors," *Rep. Prog. Phys.*, 41, 2, pp. 157-258 (1978), and C. T. Sah, L. Forbes, L. L. Rosier and A. F. Tasch, Jr., "Thermal and Optical Emission and Capture Rates and Cross Sections of Electrons and Holes at Imperfection Centers in Semiconductors from Photo and Dark Junction Current and Capacitance Experiments," *Solid-State Electronics*, 13, 6 (1970), pp. 759-88.

As mentioned, a common use of photocapacitance in the scientific community is to determine inter-band-gap state information in a semiconductor. FIGS. 1A and 1B show inter-band-gap state information of a semiconductor material, and the corresponding photocapacitance data, obtained from Blood et al. FIG. 1A shows a representational view 100 of an electron band-gap 110 between an upper conduction band edge 120 and a lower valance band edge 130.

A photon 140 having energy $E_{hv}>0.465$ eV strikes a trap within the bandgap 110 to ionize position $N_1^+$ at 0.465 eV transferring to the resultant electron 145 sufficient energy for quantum transition to the conduction band edge 120. FIG. 1B shows a graphical view 150 of normalized capacity as a function of photon energy $E_{hv}$, with the latter as the abscissa 160 and the former as the ordinate 170.

A series of stepped electron capacitance values 180 demonstrates a series of normalized capacity values from 0.4 eV to about 1.6 eV. Several states are identified at photon energies of 0.465 eV, 0.73 eV, 0.78 eV etc. The state at 0.73 eV shows a positive change in capacitance signifying a donor-like state. By contrast, the nearby state at 0.78 eV shows a negative change in capacitance signifying an acceptor-like state. In this manner, a photocapacitor can respond to the photon energy (frequency) as provided in various exemplary embodiments. In addition, other exemplary embodiments provide for controlling capacitance by changing the light intensity.

SUMMARY

The photocapacitor has not been commercially exploited, but such a device has advantages addressed by various exemplary embodiments of the present invention. Previously, the capacitance of commercial semiconductor capacitors could be varied by means of applied voltage. Such devices, known as varactors, require connection wires that could interfere in materials, such as electromagnetic applications, for example.

Various exemplary embodiments provide a photocapacitor device for responding to photons having at least a specified energy. The exemplary photocapacitive device includes a first portion composed of a photocapacitive material; a second portion composed of a non-photocapacitive material; and a depletion region disposed between the first and second portions. The photocapacitive and non-photocapacitive materials respectively can have first and second Fermi-energy differences.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which:

FIG. 7 is a representational diagram of a single deep level interband state, or trap;

FIG. 8 is a cross-sectional view of an example two-junction photocapacitor device; and FIG. 9 is a representational view of a band diagram for a junction.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Photocapacitance has not been exploited for commercial, defense or other application, so far as known. In various exemplary embodiments, photocapacitance can yield devices in which the value of capacitance can be changed by the intensity of light. This is markedly different from the way the technical community uses photocapacitance where the capacitance changes due to the wavelength of the impinging light, or equivalently its photon energy.

Photon wavelength $\lambda$ relates to the energy of light (as proportional to the reciprocal of frequency $\nu$) by $E_{h\nu}=hc/\lambda=h\nu$ where h is Planck's constant and c is the speed of light. Further, techniques for fabricating the photocapacitor structure are provided that can be used to control desirable properties. Artisans of ordinary skill, e.g., electrical engineers, will find many applications for a photo-sensitive capacitance without departing from the scope of the claims, some uses of which are identified below.

One application for photocapacitance is for tunable metamaterials. Typical metameterials depend on resonances are inherently single frequency. This limitation can be overcome by employing tunability. Metamaterials can be used in lenses, cloaking envelopes, antennaes and other electromagnetic applications.

Another application of the photocapacitor includes a wide dynamic range optical sensor. For example, photocapacitors can be fabricated from undoped semi-insulating (USI) gallium arsenide (GaAs) that has sensitivity to light energy at the dominant active trap (second energy level EL2) with an ionization energy of 0.684 eV at 300K. See D. C. Look and Z.-Q. Fang, "On the energy level of EL2 in GaAs," *Solid-State Electronics*, 43, 7 (1999), pp. 1317-19 that indicates an energy value less than the band-gap of 1.424 eV at room temperature (293K).

Figures 1A, 1B:
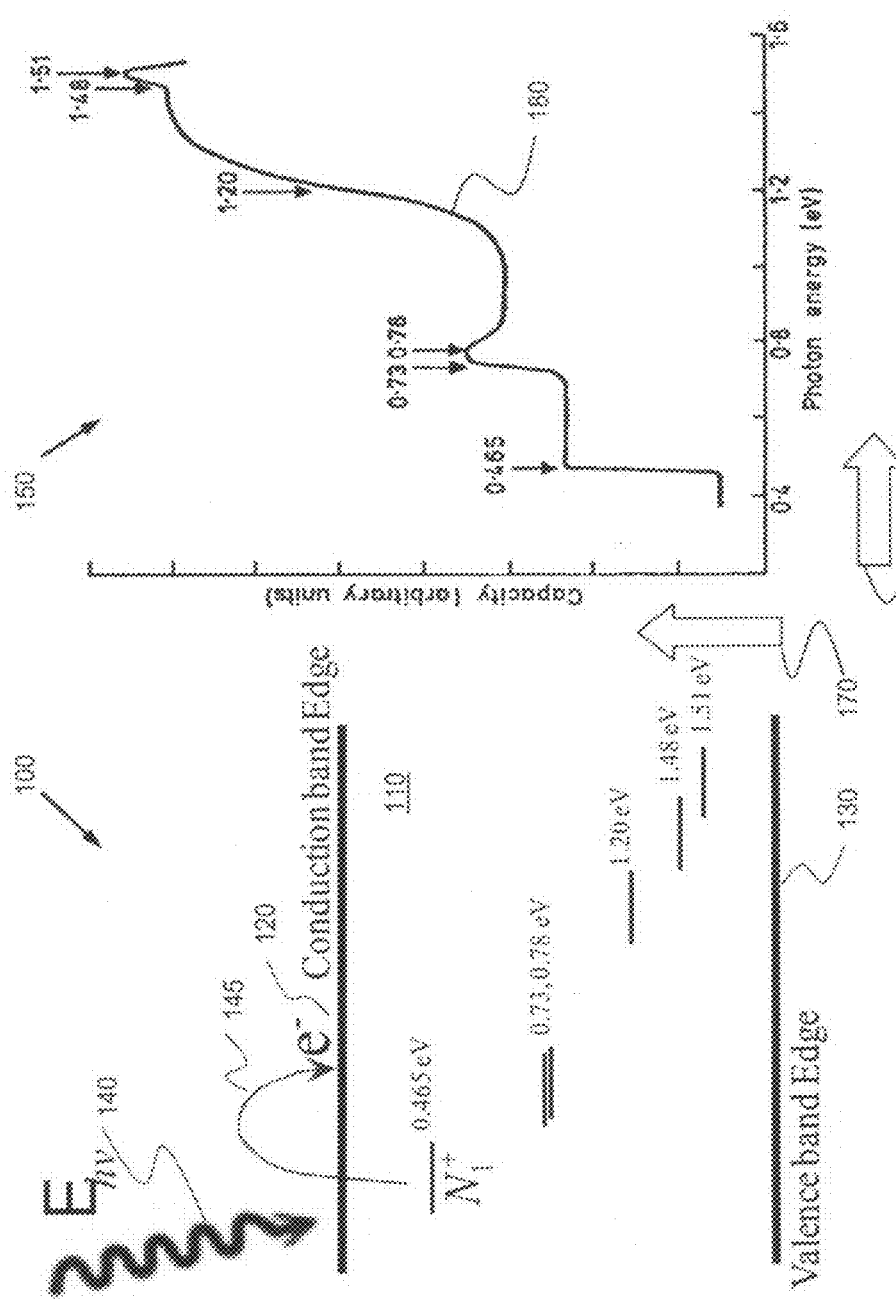
FIG. 1A is a representational view 100 of an electron band-gap with interband electronic states associated with various traps.
FIG. 1B is a graphical view of normalized conduction band capacity identifying interband electronic states as a function of photon energy.

The photocapacitor as described utilizes any one of the interband states as shown in FIG. 1A. Rather than employ light of sufficient intensity to ionize the traps associated with that state to a maximum amount, as performed in the scientific community for material characterization purposes, various exemplary embodiments provide a photocapacitor that continuously responds to variable light intensity, thereby effectively riding up or down the sharp transition in capacitance associated with one of in the states shown in FIG. 1B. Any state can be chosen for use, or multiple states can be utilized in various exemplary embodiments.

Various exemplary embodiments describe at least one device called a photocapacitor based on a variation of the photocapacitance effect. The photocapacitance effect has been used in scientific discovery to learn properties of semiconductor materials. However, this phenomenon has not otherwise been exploited for purposes of producing a useful device. The photocapacitor described herein employs the light intensity level to control the inherent variation in capacitance, in contrast to the scientific use that normally uses light frequency to obtain information from a corresponding variation in capacitance. Various exemplary embodiments for designing a photocapacitor are described, which can be used to optimize photocapacitor design parameters for useful applications.

In particular, the photocapacitor uses the photocapacitance effect of a semiconductor or semi-insulator material with one or more junctions. Within this disclosure, the term "semiconductor" indicates any one of semiconductor, semi-metal or semi-insulator. The junctions can be alternatively made from one or more of metallic materials, semiconductor materials, semi-metal materials, and quasi-photocapacitor semiconductors (doped differently from the photocapacitor). The junctions can serve both to form the photocapacitance region in a desired way and as electrical terminals.

One example application enables tunability of electromagnetic devices without incorporating wires that can otherwise interfere with such devices. Also, photocapacitance can be used for novel types of sensors and imagers of electromagnetic radiation in the infrared, visible or ultraviolet or higher frequency parts of the spectrum, depending on the material, and trap level within the material. Photocapacitance can be used to detect charged or uncharged particles where the particle plays the role of a photon change in capacitance. As another example, electrical engineers employ photocapacitance in electronic circuit applications in which sensitivity to light controls part of the circuit.

Additional example applications of photocapacitance devices include the coupling of output signals of optical communications, or optical computer components and devices, to standard solid state electronic devices and systems. Other examples can be found in tunable electromagnetic devices that include but are not limited to filters (e.g., notch, bandpass, high-pass, lowpass), waveguides that operate above or below the cut-off region, absorbers, transmitting or receiving antennae, and other tunable electromagnetic devices. In yet another example, photocapacitance can be used as a sensor, or part of a detector, in which light detection is secondary to detection of a primary phenomenon, such as chemical or biological agents for example.

In various exemplary embodiments, the use of materials at junctions can control the Fermi-energy position thereby forming a photocapacitor with controllable and desirable properties. The control of the Fermi-energy position at the junction relates to the Fermi-energy position within the bulk material, which can also be controlled. At thermal equilibrium, Fermi-energy remains steady. Outside of thermal equilibrium, such as through photo injection for example, the "imaginary" Fermi-energy is sometimes called Imref for Fermi written backwards.

One well known application involves tuning a split-ring resonator (SRR). This is accomplished by changing the capacitance in the inductorcapacitor circuit of an SRR. Success of this method is provided in U.S. Pat. No. 7,525,711 to Rule et al., achieving a tunable range ratio of 15:1. See also K. A. Boulais, D. W. Rule, S. Simmons, F. Santiago, V. Gehman, K. Long, and A. Rayms-Keller, "Tunable split-ring resonator for metamaterials using photocapacitance of semi-insulating GaAs," *Appl. Phys. Lett.*, 93, 043518 (2008).

Varactor diodes represent an example alternative technique for varying capacitance, in this case by altering the applied voltage across its terminals. However, these suffer from the limitation that wires must be used to transfer a voltage to each device. The wire can interfere with an application such as for example, electromagnetic applications unless careful and restrictive design considerations are employed. See D. Wang, H. Chen, L. Ran, J. Huangfu, J. A. Kong, and B. Wu, "Reconfigurable cloak for multiple operating frequencies," *Appl. Phys. Lett.*, 93, 043515 (2008).

In an exemplary embodiment, a photocapacitor can be used in conjunction with the varactor effect within the same device. Such operation includes a choice of capacitance variation methods via optical, electrical or both simultaneously.

A single junction semiconductor device can be formed using component configurations such as n-p, n-i, and p-i, where n represents n-type semiconductor, p represents p-type semiconductor, i represents insulating-type semiconductor. Alternatively, the junctions can be metal-semiconductor, e.g., Schottky junctions, such as m-n, m-p, and m-i, where m represents a metal. The components at either end need not be composed of the same material. In some multi-junction devices, photocapacitance may form only at one of the junctions or at multiple junctions. Combinations of these junctions can be used to make multi-junction devices so long as the junction includes a region of photocapacitance.

Capacitance naturally develops when two semiconductors of different types (n, p or i) or a metal and a semiconductor are brought into intimate contact. This contact should be distinguished from an ohmic contact that lacks such capacitance. The capacitance junction can be produced by diffusion of one material into another material, or by epitaxial growth of one material onto another, or by some other methodology established in the semiconductor art.

Capacitance forms over a region naturally depleted of free charge known as the depletion region. Capacitance C changes over this region as the charge in the region shifts between a charge state and a neutral state according to the definition:

$$C \equiv \frac{dQ}{dV}, \tag{1}$$

where Q is the effective charge in the region, and V is a measuring voltage across that region.

For a p-n junction, the capacitance C is determined as shown by R. S. Muller and R. I. Kamins, *Device Electronics for Integrated Circuits*, 2/e, John Wiley & Sons, N.Y. (1986), as:

$$C = \frac{\varepsilon_s}{x_d} = \sqrt{\frac{q\varepsilon_s}{2\left(\frac{1}{N_a} - \frac{1}{N_d}\right)(\phi_i - V_a)}}, \tag{2}$$

where q is the elemental charge on a free electron, $x_d$ is the depletion width, $\varepsilon_s$ is the permittivity of the semiconductor, $N_a$ and $N_d$ are the ionized doping densities of the p-region (acceptor) and the n-region (donor), respectively, $\phi_i$ is the built-in (i.e., intrinsic, as a term of art) potential that naturally occurs across the junction, and $V_a$ is the applied potential. Artisans of ordinary skill in semiconductor physics will recognize that the depletion capacitance has been normalized to cross sectional area. In the varactor, the applied potential $V_a$ dynamically controls the capacitance. This voltage can be assumed to be zero for purposes of this disclosure in order to describe photocapacitance, unless otherwise specified.

Note that eqn. (2) applies to a single p-n junction and capacitance might differ for multi-junction capacitors. For a two-junction capacitor, junction-1 and junction-2 are arranged in series, and their respective capacitances add in series as $$\frac{1}{C_t} = \frac{1}{C_1} + \frac{1}{C_2}, \tag{3}$$

where $C_t$ represents the series equivalent of the capacitances $C_1$ and $C_2$ of the first and second junctions.

Deep level traps in a depletion region are mostly responsible for the photocapacitance effect. Ignoring shallow donors and acceptors, eqn. (2) can be rewritten in the form:

$$C_d = \sqrt{\frac{q\varepsilon_s N_t^+}{2\phi_i}}, \tag{4}$$

where $N_t^+$ are the ionized traps. Free carriers constitute electrons and holes. Generation and recombination is influenced thermally as well as optically.

In photocapacitance, the capacitance is controlled by optically ionizing these traps. This simple model can describe the operation of photocapacitance, but often necessitate numerical techniques to accurately include all influences of free carrier drift, free carrier diffusion, trap generation of electrons and holes, trap recombination of electrons and holes, and direct or indirect recombination of electrons and holes (between the conduction and valance bands). In such cases, photocapacitance may still exist despite the depletion region not being fully depleted of free charge. Any of these processes can have strong influences on the behavior of a photocapacitor. The trap electrons are many orders of magnitude fewer than the valance electrons.

Figure 2:
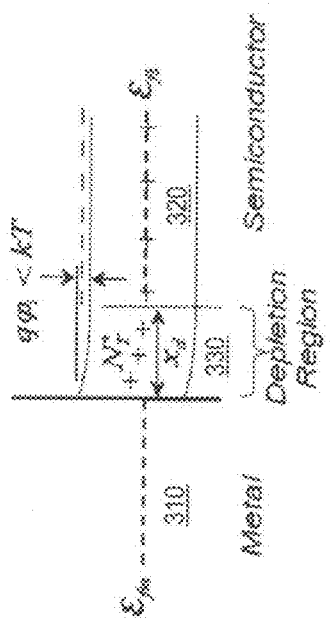
FIG. 2 is an electron energy band diagram of a voltage controlled semiconductor capacitor known as a varactor.

FIG. 2 shows a first electron energy band diagram view 200 of a Schottky junction between a metal and an n-type semiconductor established as a varactor. On the left is a metal conductor 210. On the right is a semiconductor 220. A depletion region 230 of distance $x_d$ separates the metal 210 and semiconductor 220 from each other. The potential difference between the metal 210 and semiconductor 220 is q $(\phi_i - V_a)$.

Optical stimulation of a center depletion region 230 results in only minor response because there exist no deep level traps, and because the shallow traps $N_d^+$ (that represent shallow ionized donors) are typically already fully ionized by thermal energy at room temperature. Thus, the only effective manner to dynamically change capacitance involves using $V_a$ according to eqn. (2).

Figure 3:
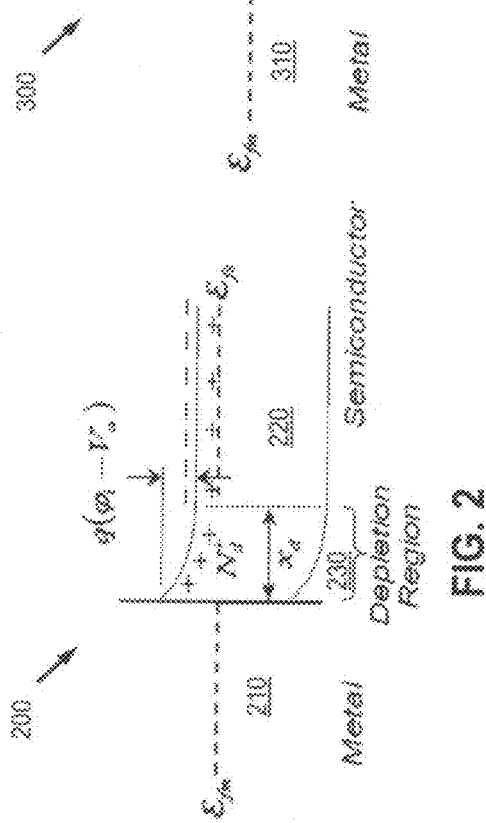
FIG. 3 is an electron energy band diagram of an optical controlled capacitor known as a photocapacitor.

FIG. 3 illustrates an energy band diagram of a junction established as a photocapacitor. The active semiconductor has deep level traps. This constitutes one major distinction with the varactor of FIG. 2. Such traps can exist as defects, such as a result of some growth techniques in GaAs, for example, or as deliberately embedded impurities. The deep level trap known as EL2 represents an example of a defect in GaAs, presumed to be an arsenic anti-site. The density of EL2 traps can be controlled through some growth techniques (such as the Czochralski method). Copper (Cu) constitutes an example of a dopant impurity that produces a deep level trap in GaAs.

The photocapacitance region can include shallow dopants or impurities and deep traps as ionized N quantities as distinguished components as:

$$C_d = \frac{\varepsilon_s}{x_d} = \sqrt{\frac{q\varepsilon_s(-N_a^- + N_d^+ + N_{tt}^+ + \Delta N_{to}^+)}{2\phi_i}}, \tag{5}$$

where impurities constitute the first two parenthetical terms in which $N_a^-$ represents ionized shallow acceptors, and $N_d^+$ represents shallow ionized donors. Artisans of ordinary skill will recognize that pure intrinsic GaAs devices can be difficult to fabricate in ideal form, and sometimes $N_a^-$ and $N_d^+$ can represent unintentional impurities. Deep level traps may be used to compensate for the unintended dopants so that the USI behaves as though being nearly pure. Also, deep level traps include the last two parenthetical terms in which $N_u^+$ represents thermally induced ionized traps, and $\Delta N_{to}^+$ represents variable optically induced ionized traps.

Often, the charge neutrality under thermal equilibrium conditions balance in eqn. (5) dictates that the term $-N_a^- + N_d^+ + N_u^+ = 0$, which leaves:

$$C_d = \frac{\varepsilon_s}{x_d} = \sqrt{\frac{q\varepsilon_s \Delta N_{to}^+}{2\phi_i}}. \tag{6}$$

This procedure reveals an advantage in eqn. (6) in that the capacitance variation can be quite sensitive to optical stimulation. The charge neutrality effect indicates that small changes (relative to the densities $N_a^-$, $N_d^+$ and $N_u^+$) in $\Delta N_{to}^+$ can have pronounced effect on capacitance. Further, the optical amplitude can be used to control the capacitance as opposed to changes in optical frequency as typically used in the scientific community, although both controls can be used separately or together.

The use of junction materials with alternate specifications to fabricate photocapacitors represents another advantage of this process. By using doped semiconductors, metals, or even chalcogenides, the built-in potential $\phi_i$, can be adjusted such that the specified photocapacitance fits a desired function. The relationship between the built-in potential and the capacitance is evident in eqns. (2) through (6).

In some cases, such as typically in GaAs, the Fermi energy is pinned (i.e., restricted) at the semiconductor device. This renders the built-in potential $\phi_i$ difficult to modify. The reasons for pinning are not well understood but at any rate can be compensated for by creating a junction of the same material thereby unpinning the Fermi energy. Controlling the built-in potential of the photocapacitor potential $\phi_i$ can be accomplished by doping the added material, thereby constituting another advantage of this process. This doping material can be, for example, a p-type GaAs on semi-insulating GaAs.

Methods to illuminate the photocapacitor can include direct illumination by a light-emitting diode (LED), an organic LED, a laser, a thermal source or other means so long as the light energy is sufficient to ionize the desired traps. Other means include light-guides that can carry the optical intensity to the photocapacitor from a distance away.

Typically, light having photon energy sufficient to ionize a trap can be used to induce the photocapacitance effect. For photon energy less than the bandgap energy, the light can travel far through the semiconductor to achieve a greater effect. However, light having photon energy greater than the bandgap can be used for some device applications. The photocapacitance effect can be used in conjunction with a varactor. Also, a varactor can be used as the primary source of capacitance, which is thereby controlled through a photovoltaic device, thereby creating a different type of photocapacitor. A varactor can be used to set an effective bias, or sensitivity range for the photocapacitance effect, for example. Light sensor applications can take advantage of a wide range of capacitance values, normally found in photocapacitance, thus enabling creation of a wide dynamic range sensor. The sensor can be fabricated in a pixel array, for example, to be used in a wide dynamic range imager.

Junction capacitance in a semiconductor occurs near a Schottky junction (non-ohmic, metal-semiconductor junction), or a p-n junction. This capacitance exists across the depletion region 230, and is recognized by those skilled in the art of semiconductor device physics. As described above, FIG. 2 represents the Schottky's electron energy band diagram 200 that shows a depletion region near the junction of a metal 210 and an n-type semiconductor 220. An analogous capacitance exists across the depletion region 330 for the photocapacitor's electron energy band diagram 300. The depletion-width is given by $x_d$ where the energy bands curve upwards.

The built-in electric field, due to the energy band curvature between the metal 210 and the semiconductor 220, explains the reason the depletion region 230 is void of free electrons, being swept out. Also, this explains why free electrons (−charge) remain in the bulk semiconductor material 220 where the electric field may be assumed to be small or null. The depletion capacitanced forms across the depletion region 230.

For Schottky junctions formed with p-type semiconductors, the curvature of the energy bands in the depletion region 230 would curve down-wards instead of upwards, and the depletion region 230 would be void of hole-type charge in a similar way. Depletion regions are also found in p-n junctions in which the depletion regions form within both the n-type and the p-type materials dispersed according to their doping density ($N_d$ or $N_a$) as provided in eqn. (2).

The Fermi-energy position in the bulk semiconductor 220 and 320 is often determined under thermal equilibrium conditions from Fermi-Dirac statistics. The depletion regions 230 and 330 stem from proper alignment and control of the relative Fermi-energy positions at the junction, and within the respective semiconductors 220 and 320. One advantage of this method is that metals, semiconductors, or other materials can be used to control the Fermi energy difference, thereby controlling the built-in potential $\phi_i$.

In some cases, such as typically in GaAs, the Fermi energy is pinned (i.e., restricted) at the semiconductor surface. This renders the built-in potential $\phi_i$ difficult to modify. The reasons for the pinning are not well understood but in any case can be compensated for by making a junction of the same material. Controlling the built-in potential of the photocapacitor $\phi_i$ can be accomplished by doping the added material, constituting another advantage of this process. This doping material can be, for example, an n-type GaAs on semi-insulating GaAs.

The EL2 band-gap restriction is only due to the high level of absorption typical for above band-gap photon energy that generally prevents light from penetrating far enough into the semiconductor 320 as shown in FIG. 3. This application can take advantage of a wide range of capacitance values normally found in photocapacitance, thus making a wide dynamic range sensor. The sensor can be fabricated in a pixel array, for example, to be used in a wide dynamic range imager.

Yet another application of the multi-junction photocapacitor includes an electronic circuit that has sensitivity to light. For example, photodiodes or phototransistors are often used to detect light and perform a task in response. The multi-junction photocapacitor can be used similarly in circuits to perform a task in response to light, in which the task can include switching a device on or off, or controlling the state of a device in a continuous way, or detecting an amount of light impingent on the circuit, or to tune a resonant circuit or frequency. Other electro-optic circuit uses may be also considered and this disclosure should not be limited to those applications discussed here.

Inducing an optical control signal onto a photovoltaic device constitutes another process to provide photocapacitance, in which the photovoltaic device reacts by inducing a voltage and in turn changes $V_a$ in eqn. (2). The photovoltaic device can be of a semiconducting nature, a semi-insulating nature or a polymer nature. Very little current (leakage current only) is drawn from the photovoltaic device because the junctions represent back-to-back diodes in reverse bias mode.

The depletion approximation is known to those skilled in the art and has been used to derive eqn. (6). However, with involvement of deep level traps, or small amounts of energy band bending, the depletion approximation may no longer be valid, and numerical techniques may be required to describe the depletion region quantitatively. In some cases, the depletion region might not be completely depleted of free charge. Nonetheless, eqn. (6) is useful to describe photocapacitance qualitatively.

Trap dynamics includes the recombination and generation of electrons and holes with the conduction band and valance band, respectively. The trap dynamics represent an important part of photocapacitance and must be included in numerical solutions. These trap dynamics include interactions with phonons (thermal), photons or other particles, and often described using Shockley-Hall-Read statistics, known to artisans of ordinary skill in semiconductor physics. See W. Shockley and W. T. Read, "Statistics of the Recombinations of Holes and Electrons," *Phys. Rev.*, 87, 835 (1952), and R. N. Hall, "Electron-Hole Recombination in Germanium," *Phys. Rev.*, 87, 387 (1952). Another parameter that can be controlled includes the ionization energy of the trap density $N_T$, also described in Shockley and Read.

Generally, a strong photocapacitance effect requires deep level traps within the band-gap of the semiconductor 320 in which the ionized traps (+charge) are near mid-gap with an ionized trap density $N_T^+$. These traps are assumed to be donor type, and so free electrons are shown in the conduction band of the bulk material semiconductor 320 due to trap ionization. For deep traps (although not necessarily near mid-gap), thermal energy at room temperature may generally not be enough to ionize all the traps. For the USI example above, only about 10% of the traps are ionized at room temperature. This can reserve up to 90% of the traps available for ionization by light. The process is similar for acceptor type traps where the ionized trap would be a negative charge.

Without controlling the photocapacitor using voltage, as in a varactor, the applied voltage $V_a$ can be assumed to be zero. In such cases, the depletion capacitance $C_d$ can be approximated as:

$$C_d = \frac{\varepsilon_s}{x_d} = \sqrt{\frac{q\varepsilon_s N_T^+}{2\phi_i}}. \tag{7}$$

Note that $N_d^+$ in eqn. (6) is replaced with $N_T^+$, the ionized trap density. From eqn. (7) one can observe that by changing the amount of trap photo-ionization based on trap density $N_T^+$, a change in capacitance may result. Because $N_T^+$ varies as a function of light intensity by the proportion $\Delta N_T^{+\alpha P4}$, capacitance can be monotonically and continuously controlled through the intensity of light based on its photosensitivity. Experimental results show that control can be achieved by an intensity of 5 mW/cm². The amount of band bending within the photocapacitor depletion region 330 (FIG. 3) is less than that of the analogous varactor depletion 230 (FIG. 2). For a very small band bending in which the built-in potential is less than the thermal energy, the depletion capacitance $C_d$ can be further approximated as:

$$C_d = \frac{\varepsilon_s}{L_D}, \tag{8}$$

where $L_D$ is the Debye length. The Debye length is generally not a function of the built-in potential $\phi_i$, and thus the photocapacitors, in these cases, do not suffer from non-linearity. For example, in an electromagnetic application, the electromotive force (EMF) produced by the field across the photocapacitor does not distort the capacitor, which in turn can influence the electromagnetic signal in a non-linear manner such as producing unintended harmonics in the signal.

By contrast, the case of a varactor as described by eqn. (6) shows that any change in applied voltage is summed with the built-in potential $\phi_i$, and thus affects the energy band bending as shown in FIGS. 2 and 3. Thus, if the capacitor is used in a resonator, the alternating voltage affects the capacitance in a non-linear way, which can generate harmonics adverse to the application.

Figure 4:
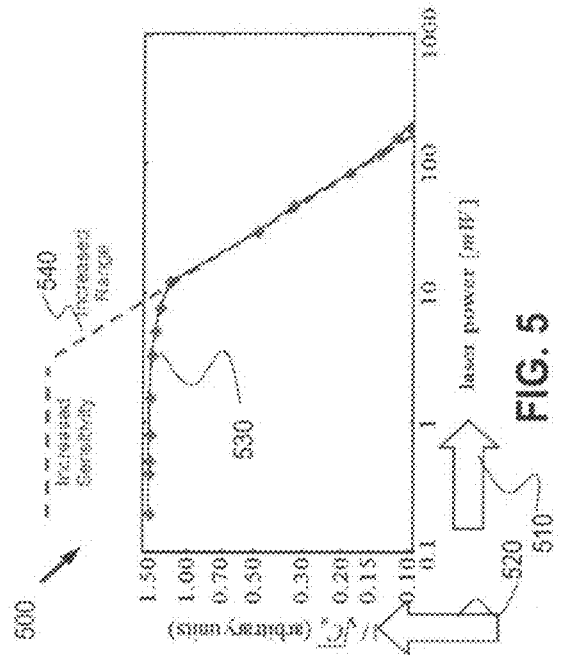
FIG. 4 is a graphical view of a results plot of capacitance from a photocapacitor and its sensitivity to light at high frequencies.
Figure 6:
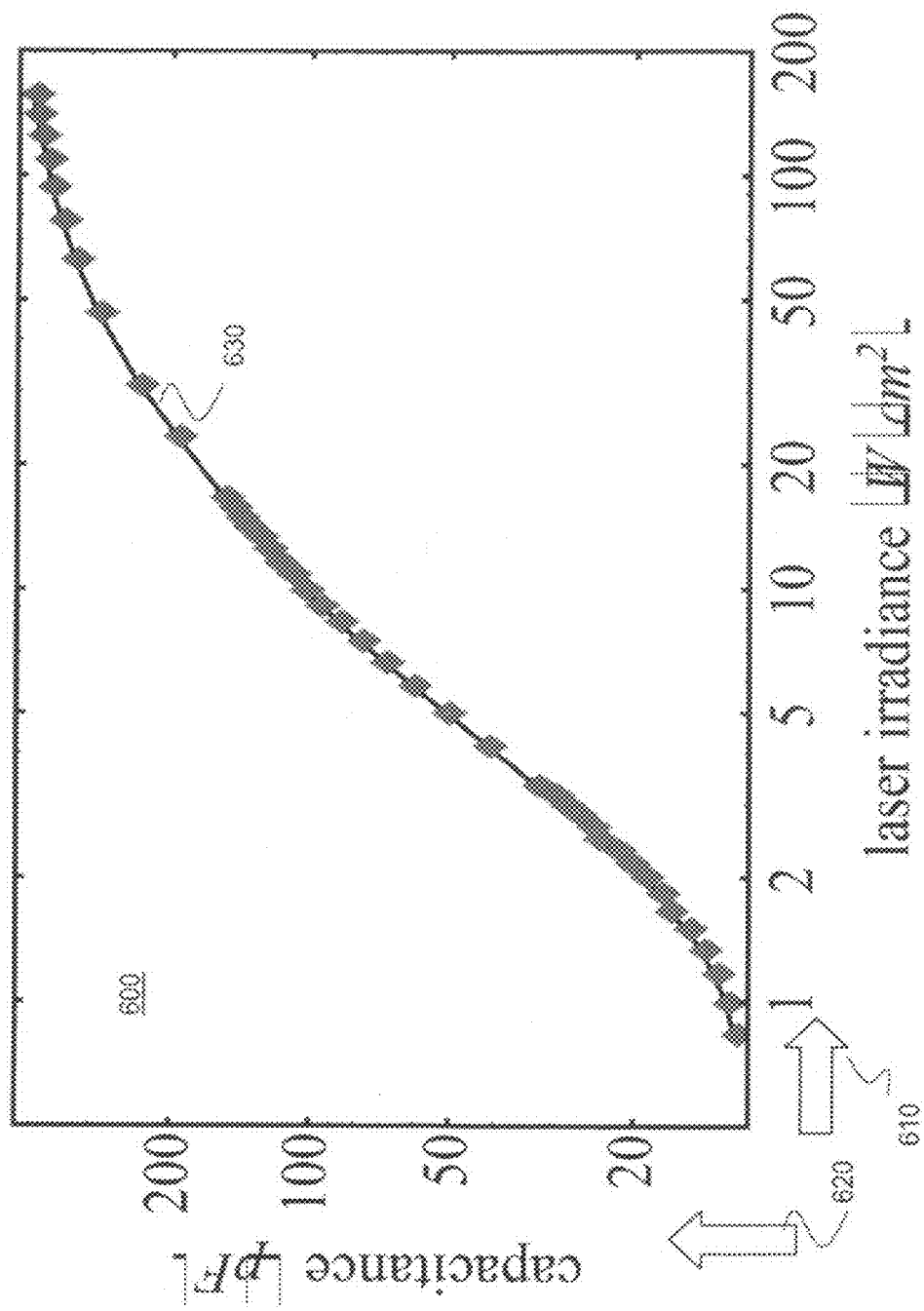
FIG. 6 is an augmented graphical view of a results plot from a photocapacitor and its sensitivity to light at a low frequency.

Exact analytical forms for the depletion capacitance may be difficult to derive analytically. However, the relationship between capacitance and light intensity can be empirically determined by experiment. FIG. 4 depicts a response curve in a logarithmic plot 400 for exemplary results from a photocapacitor fabricated from USI GaAs at a fixed light wavelength 975 nm. Aluminum contacts were used to form a two-junction device. Light irradiance P in watts-per-square-centimeter represents the abscissa 410 and depletion capacitance $C_d$ in pico-farads is the ordinate 420. (FIG. 6 provides another complimentary plot, described further herein.) Experimental results that demonstrate control can be achieved for example by an intensity of less than 5 mW/cm².

A threshold level 430 at 100 pf denotes the maximum capacitance for power-law correlation. In this example, the data, represented by an empirical line 440 of measured values, show the relationship between capacitance and USI to be a correlation line 450 corresponding to the proportional relation $C_d \propto P^{1.1}$, where P is the flux intensity of light impinging on the photocapacitor. That proportional relation remains valid over much of the photocapacitance range. More exact theoretical relationships can be determined using numerical techniques.

Location of a deep level trap can significantly influence the behavior of photocapacitance, and thus can be used to design photocapacitors with desired properties. For example, if a trap is located above midgap, then a photon having energy less than the bandgap energy $E_g$ or $h\nu < E_g$ can be used to generate electrons only. Typically traps affect both electrons and holes, and these depend on the trap dynamics.

Various exemplary embodiments disclose techniques to fabricate photocapacitors towards controllable and desirable properties. Two fundamental categories of processes can be used to control the state of photocapacitance: first—control the type, location and density of deep level traps, and second—control the structure that in effect, controls the relative Fermi-energy throughout the structure. Through end of this section, the USI example can be assumed as the exemplary condition. USI photocapacitors have many of the elements that demonstrate the advantages of the methods in this, such as for type, energy location and density of deep level traps.

For USI, eqn. (7) may be rewritten to account for the effects of unintentional shallow donor atoms of density $N_d^+$, and unintentional shallow acceptor atoms of density $N_a^+$, which are usually present in USI. Artisans of ordinary skill recognize that true intrinsic GaAs devices can be difficult to fabricate. Often, such a device includes unintentional states within the band-gap. Deep level traps may often be used to compensate for the unintended dopants so that USI behaves as though it were nearly pure, rendering semi-insulating behavior by depletion capacitance:

$$C_d = \sqrt{\frac{q\varepsilon_s(N_d^+ - N_a^- + N_{Tt}^+ + \Delta N_{To}^+)}{2\phi_i}}, \quad (9)$$

where $N_d^+$ and $N_a^-$ represent donor and acceptor densities assumed to be fully ionized and constant, the fully ionized trap density $N_T^+$ has been separated into a constant thermal component $N_{Tt}^+$, and an optical component $\Delta N_{To}^+$ that varies with light intensity. Under select circumstances, the sum of donor, acceptor and trap densities approach zero, as $N_d^+ + N_a^- + N_{Tt}^+ \to 0$.

Moreover, eqn. (9) for depletion capacitance can be further simplified by summing the thermal ions as:

$$C_d = \sqrt{\frac{q\varepsilon_s(N_{it} + \Delta N_{To}^+)}{2\phi_i}}, \quad (10)$$

where $N_{it}$ represents the density summation over all thermally ionized species assumed to be constant with a value given at a particular temperature.

From eqn. (10), light intensity $\Delta N_{To}^+$ must overcome density summation $N_{it}$ for any change in capacitance to occur. Thus, sensitivity and enhanced range can be dramatically improved by fabricating the semiconductor material such that $N_{it}=0$. This can be accomplished through tight control, or the intentional addition of shallow impurity densities to null the deep-level thermal-ion density of the traps $N_{Tt}^+$. Note that only the net impurities for density summation $N_{it}$ need vanish and not each individual species.

Figure 5:
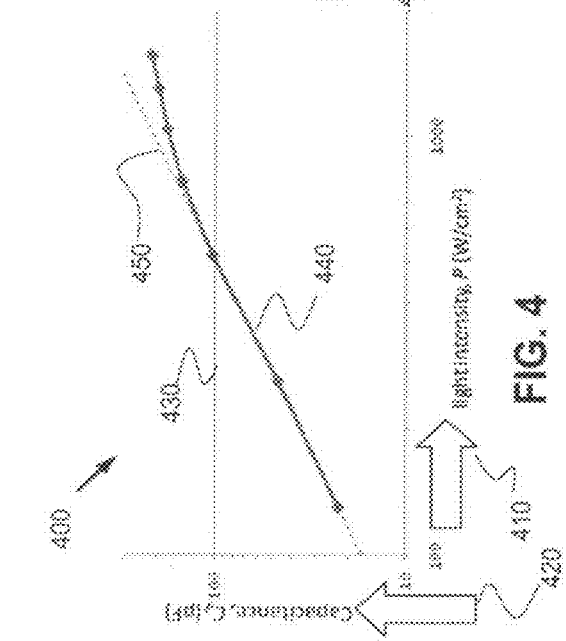
FIG. 5 is a graphical view of a plot of photocapacitance sensitivity to light intensity at high frequencies.

FIG. 5 shows a graphical plot 500 of reciprocal square root of depletion photocapacitance as a function of laser power in milli-watts as the abscissa 510. The result of this effect in the plot 500 illustrates reciprocal capacitance $1/\sqrt{C_d}$ as the ordinate 520 against laser power.

The diamond points along solid curve 530 represent experimental data for light wavelength fixed at 975 nm at low frequency (1 MHz). The plateau in the data results from a non-zero thermal-ion density $N_{it}$. The dash line 540 represents the extension of range and sensitivity (thus necessitating less intensity to initiate a change in capacitance) of photocapacitance in the limit as $N_{it} \to 0$, indicating enhancement of photocapacitance sensitivity and range resulting from a reduced fixed thermal ion density in the semiconductor material.

FIG. 6 depicts an augmented logarithmic plot 600 for exemplary results from a photocapacitor fabricated from USI at a fixed light wavelength 975 nm. Light intensity P in watts-per-square-centimeter represents the abscissa 610 and depletion capacitance $C_d$ in pico-farads is the ordinate 620. Diamond data points form a sinusoidal quarter-wave curve 630 that approaches 400 pF capacitance at peak intensity above 100 W/cm².

The fill trap density normalized to the total number of traps $f_T$, as fill factor, can be solved using Shockley-Hall-Read statistics as:

$$f_T = \frac{e_p^{th} + e_p^o + C_n}{e_n^{th} + e_n^o + C_n + e_p^{th} + e_p^o + C_p}, \quad (11)$$

where $e_n^{th}$ and $e_p^{th}$ are the thermal electron and hole emission rates, respectively, $e_n^o$ and $e_p^o$ are the optical electron and hole emission rates, respectively, and $C_n$ and $C_p$ are the electron and hole capture rates (by the traps), respectively. With no optical stimulus, eqn. (11) reduces to $$f_T = \frac{e_p^{th} + C_n}{e_n^{th} + C_n + e_p^{th} + C_p} = 0.91, \quad (12)$$

where the fill factor value 0.91 is calculated for typical values in USI.

On the other hand, with levels of optical stimulation high enough that the optical effects overcome the thermal effects, the fill factor $f_T$ in eqn. (11) reduces to:

$$f_T = \frac{e_p^o}{e_n^o + e_p^o} = \frac{\sigma_p^o}{\sigma_n^o + \sigma_p^o} = 0.375, \quad (13)$$

using typical values for USI, and where $e_n^o = I_o \sigma_n^o$ and $e_p^o = I_o \sigma_p^o$ where $\sigma_n^o$ and $\sigma_p^o$ are the optical ionization cross sections at the wavelength of light, and the optical intensity $I_o$, divides out of the equation. Thus, the optical ionization $\Delta N_{To}^+$ n eqn. (10), can vary between 9% and 62.5% of the total trap density $N_T$.

The reason for this limit of 62.5% of the total trap density $N_T$ is because the trap exists at mid-gap, and so the energy of the light used to ionize those traps (by generating electrons) can also neutralize the traps (by generating holes) concurrently. Thus, photocapacitance range can be improved by selecting a deep level trap at an energy that is not at mid-gap.

For example, FIG. 7 shows a representational diagram 700 of a deep donor-type trap closer to the conduction band than to the valence band. By selecting light with a photon energy as the product of Planck's constant and frequency hv, sufficient to ionize those traps through electron generation, but insufficient to neutralize the traps through hole generation, then $\sigma_p^o = 0$. In turn, the corresponding fill factor $f_T$ in eqn. (13) would be zero, meaning that the trap level could have a much higher level of ionization.

FIG. 7 depicts the energy band diagram 700 showing a deep trap at energy slightly closer to the conduction band edge than the valence band edge. A band-gap 710 exists between a conduction band edge 720 and a valance band edge 730, with a mid-gap energy level 740 in between. A deep trap energy 750 (such that thermal energy does not ionize a significant quantity of traps) lies between the mid-gap energy 740 and the conduction band edge 720. This enables an electron to absorb photon energy for jumping to a higher level. Photon energy hv can be chosen to have sufficient energy to generate electrons, thereby ionizing the traps, such as at energy 750, but not enough energy to generate holes for neutralizing the trap.

Another advantage of this process includes reducing capacitance loss because holes would not be generated that could be swept across the depletion region. Yet, another advantage is that the number of p-type shallow acceptors can be increased to match an increased number of deep level donors, thereby increasing the number of free charge in the bulk region while maintaining the condition $N_{it}=0$. This further and significantly decreases loss by increasing the density of free carriers in the bulk region. Another process involves inserting dopants that constitute true traps at mid-gap, and not recombination centers. Yet another advantage involves the ability to employ multiple traps to control both the electron generation and the hole generation by different wavelengths of light.

Various exemplary embodiments provide for controlling design parameters by imposing control of the Fermi-energy levels throughout the structure. Ultimately, this Fermi-energy design process controls the band-bending that creates the depletion region, and therefore the depletion capacitance. As previously described, the band-bending may be subject to the Fermi-energy position at the junction relative to that in the bulk (e.g., the semiconductor). For this disclosure, a step junction may be assumed rather than a graded junction. Alternatively, graded junctions can be used for control in a similar manner, and the concepts herein are not restricted to step junctions.

Generally, a junction may be created at one surface representing a single photocapacitor. At least one photocapacitor can be formed in a single device. However, for purposes of this disclosure, only single junctions are described with the understanding that these single junctions or single photocapacitors do not limit the scope of these embodiments.

Each junction can be fabricated as n-c, p-c, m-c, or combination thereof, where n represents an n-type semiconductor, p represents a p-type semiconductor, c represents a photocapacitive material, and m represents a metal. The material in contact with the c material in all cases is utilized to control the Fermi-level at the c surface. Each junction can be fabricated as i-c where i is an insulator. This process disposes a fixed capacitor formed by the insulator in series with the photocapacitor. The process further reduces loss by preventing the flow of charge across the insulator.

For m-c junctions, common knowledge in the art of semiconductor physics includes that the band bending is a function of the difference in work functions between the metal $\Phi_M$, and the semiconductor $\Phi_S$. Thus, the built-in potential $\phi_i$ in eqn. (10) can be written as:

$$q\phi_i = q(\Phi_M - \Phi_S), \quad (14)$$

where the product $q\phi_i$ (of electronic charge and built-in potential) represents the amount of energy band bending in the depletion region.

Thus, according to eqn. (10), the initial dark value of capacitance can be controlled by this method through a proper selection of work-functions of the materials. Different metals can be used that have different work functions $\Phi$ for any particular semiconductor. Similarly, different photocapacitive semiconductors can be used that have different work functions for any particular metal.

This technique can be used with many photocapacitive materials, but not all. For example, artisans of ordinary skill will recognize that USI has an electrically active surface that tends to set the Fermi-energy at a value nearly independent of the type of metal used at the junction. In such cases, intermediate layers can be used to reduce Fermi-energy pinning.

For example, some chalcogen elements, e.g., selenium (Se) and sulfur (S), have been shown to have a Fermi-energy unpinning effect in GaAs. Thus, sandwiching a thin chalcogen layer between the metal and the photocapacitor enables Fermi-energy control at the junction. This junction would be designated as m-h-c where h represents chalcogen.

Another process to unpin the Fermi-energy position at the surface of the semiconductor uses the same type of semiconductor for the junction instead of a metal, but one that is doped differently than the photocapacitive material. This technique naturally unpins the Fermi-energy.

FIG. 8 shows an example of a two-junction photocapacitor device 800 with an exemplary p-c-p structure used to unpin the Fermi-energy at the photocapacitor surfaces. In particular, the device 800 includes a c-type photocapacitive material 810 flanked by a first p-type material 820 on the left and a second p-type material 830 on the right. Depletion region distances $x_{d1}$ and $x_{d2}$ separate the c-type material 810 and p-type materials 820, 830 from each other.

FIG. 9 shows an energy band diagram 900 for one of the junctions in the structure the device 800. This photocapacitor includes a p-c structure to unpin the Fermi-energy at the p-c surface. The p-type region 910 corresponds to the p-type material 820, 830 in the device 800. The c-type region 920 corresponds to the c-type material 810. A boundary 930 separates the regions 910 and 920 and lies within a photocapacitance depletion region 940 having distance $x_d$. The p-band-gap 950 having a Fermi-energy difference $\epsilon_{f-p}$ has a higher level than the c-band-gap 960 with a Fermi-energy difference $e_{f-c}$. The gaps are separated by the distance denoting the total depletion region 970.

This technique can also be used, to some extent, to control the initial capacitance (dark value) because those of ordinary skill recognize that the doping level of the p-type material can influence the depletion width in the photocapacitance material. Practical design considerations may suggest a $p^+$-type material that is highly doped and more conductive to help control loss in the photocapacitor system. Thus, a junction of this type would be $p^+$-c.

More complex structures can be used to further improve performance, such as an m-$p^+$-c structure, which enables wire bonding to a metal contact, and that these examples are not limiting. For example, other photocapacitance materials exist in which the traps are acceptor-like. Such structures may involve n-type, or $n^-$-type junction materials.

As another example, use of a photovoltaic device can also generate a voltage that, in turn, controls the capacitance of a varactor. This technique can include many advantages of the techniques described above because external wires to an external power supply are not necessary for various exemplary embodiments.

A photocapacitor can also be fabricated using a photovoltaic effect found in some polymers. The photocapacitor can also be fabricated from materials other than semiconductors that demonstrate charge separation in response to light. Poly-9-vinylcarbazole and a variety of other polymers with aromatic or heterocyclic chain units exhibit photo-induced discharge. The photo-response can be strongly improved by doping with a wide variety of electron acceptor molecules.

The same effects may be observed with aromatic or heterocyclic electron donor-type photoconductors when dispersed in non-photoconductive polymer and doped with electron acceptors. The reverse case is given when aromatic or heterocyclic electron acceptors are doped with small amounts (0.1-2 mole %) of electron donors and dispersed in a polymer. For example, photo-conductivity of films of poly-N-epoxypropylcarbazole (PEPC) doped with polymethine dyes (PD) with different iconicity, such as cationic (PD 1-3), squarylium (PD4), neutral (PD5), and anionic (PD6) can be exploited to built an organic photo-capacitor.

Polymethine dyes are used as sensitizers of photoconductivity and electroluminescence in photoconducting polymers based on their ability to convert light energy effectively and of the strong absorption and luminescence bands in a broad spectral region. The absorption maxima of films of PEPC with polymethine dyes are close to the respective wavelengths of light at 565 nm (PD1), 667 nm (PD2), 755 nm (PD3), 655 nm (PD4), 550 nm (PD5), and 560 nm (PD6).

The main advantages of the photocapacitor semiconductor device as described in various exemplary embodiments include the following:

(a) Light is used to control the photocapacitor, often advantageous over the varactor which uses voltage to control the capacitance. Electrical interconnects are thus not required. For example, avoidance of such connectors would benefit a radio frequency device, such as a split-ring resonator, in which wires could interfere with the radio frequency interaction.

(b) Design methods can be implemented in which harmonic generation in AC applications is minimized as opposed to the varactor device.

(c) New types of photo-electric applications are possible including, but not limited to, light-tunable electrical circuits that can be controlled with light tunable capacitance, new types of light detectors and arrays of detectors for light imaging, and new sensors where the sensitivity to light is secondary to a primary sensing method or detection method such as in the detection of biological or chemical agents.

(d) Tunable resonators for metamaterials, antennas, filters and other electromagnetic and/or electric devices, and interfaces or couplers between optical communication, optical computer components for standard solid state electronic systems.

(e) Devices that can be controlled using light (photocapacitance) and voltage (varactor) simultaneously.

(f) Wide dynamic range detectors.

(g) Detectors of which are difficult to saturate and/or damage with intense light.

(h) Photocapacitance devices that include one or multiple photocapacitors.

(i) A varactor can be used as a photocapacitor when combined with a photovoltaic device.

(j) A varactor can be used as a photocapacitor when combined with a photovoltaic polymer.

(k) Polymers that exhibit charge separation in response to light can be used as light tunable photocapacitors.

Note that a photocapacitor can be used with dual photocapacitance and varactor modes. The main advantages of controlling the fundamental initial state of the photocapacitor through type, energy location and density of traps include:

(l) Control of photocapacitor sensitivity and/or range by controlling the net thermal ionic charge through designed doping densities.

(m) Control of photocapacitor sensitivity and/or range by controlling the trap ionization level through designed choice of trap material.

(n) Control of photocapacitor sensitivity and/or range by using traps instead of recombination centers, or vise-versa.

(o) Control of photocapacitor sensitivity and/or range by utilizing multiple traps allowing control of electron generation and hole generation independently.

(p) Control of conductivity in regions of the photocapacitor associated with loss by controlling the net thermal ionic charge through designed doping densities.

(q) Control of conductivity in regions of the photocapacitor associated with loss by controlling the trap ionization level through designed choice of trap material.

(r) Control of conductivity in regions of the photocapacitor associated with loss by using traps instead of recombination centers, or vise-versa.

(s) Control of conductivity in regions of the photocapacitor associated with loss by utilizing multiple traps allowing control of electron generation/recombination and hole generation/recombination independently.

The main advantages of controlling the fundamental initial state of the photocapacitor through Fermi-energy control through the photocapacitor structure:

(t) Control of Fermi-energy position in the bulk photocapacitor material by appropriately choosing electron and/or hole traps and/or recombination centers.

(u) Control of Fermi-energy position in the bulk photocapacitor material by appropriately choosing shallow donors or acceptor states near the conduction band edge or valence band edge, respectively.

(w) Control of the Fermi-energy position at the junction using metals of different work functions.

(x) Control of the Fermi-energy position at the junction by using thin interfacial layers to reduce Fermi-energy pinning at the junction.

(y) Control of the Fermi-energy position at the junction by using another semiconductor to reduce Fermi-energy pinning.

(z) Control of the Fermi-energy position at the junction by using a semiconductor of the same type used for the photocapacitance material to reduce Fermi-energy pinning.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A photocapacitor device for responding to a photon having at least a specified energy, said device comprising:
    a first portion composed of a photocapacitive material that comprises a poly-N-epoxypropylcarbazole (PEPC) doped with at least one polymethine dye having a specific ionicity;
    a second portion composed of a non-photocapacitive material; and
    a depletion region disposed between said first and second portions.

2. The device according to claim 1, wherein said non-photocapacitive material comprises one of a p-type semiconductor material, an n-type semiconductor material, a metal, an insulator, and a chalcogen.

3. The device according to claim 1, wherein said photocapacitive material has a first Fermi-energy difference, said non-photocapacitive material has a second Fermi-energy difference with a level higher than said first difference.

4. The device according to claim 1. wherein said non-photoconductive material comprises a partially photocapacitive material and said depletion region represents a semi-depleted region.

* * * * *